US005453745A

United States Patent [19]

Kudo et al.

[11] Patent Number: 5,453,745

[45] Date of Patent: Sep. 26, 1995

[54] WIDEBAND WAVE ABSORBER

[75] Inventors: Toshio Kudo, Arida; Kiyoshi Furukawa; Yoshiaki Ueda, both of Amagasaki, Japan

[73] Assignee: Mitsubishi Cable Industries, Ltd., Amagasaki, Japan

[21] Appl. No.: 155,812

[22] Filed: Nov. 23, 1993

[30] Foreign Application Priority Data

Nov. 30, 1992 [JP] Japan .................................... 4-320439

[51] Int. Cl.$^{6}$ ............................ H05K 9/00; H01Q 17/00

[52] U.S. Cl. ................................................................ 342/1

[58] Field of Search .................................. 342/1, 2, 3, 4; 428/225, 195

[56] References Cited

U.S. PATENT DOCUMENTS 5,312,678 5/1994 McCullough, Jr. et al. ........... 428/225

*Primary Examiner*—Daniel T. Pihulic

*Attorney, Agent, or Firm*—Varndell Legal Group

[57] ABSTRACT

A wideband wave absorber of the present invention comprising a sintered magnetic tile and a mat fiber assembly comprising ferrite powder adhered directly or indirectly to the fibers therein, said magnetic powder being adhered to the mat fiber assembly by the step of (a) coating a paint composed of the magnetic powder and a latex, (b) thermally spraying the magnetic powder over the mat fiber assembly, or (c) dusting the magnetic powder on the fibers in the assembly having an adhesive layer formed on their surfaces and covering said powder with an adhesive layer, wherein said mat fiber assembly desirably has a density transition effectuated from the top surface to the inside with increasing density, or has a constant density in its entirety and comprises increasing amounts of adhered magnetic powder from the top surface toward the rear side. According to the present invention, a wave absorber can be made very thin and capable of absorbing waves over a wide range of frequencies. The thin wave absorber results in reduction of cost and can be suitably used in anechoic chambers without occupying much space.

10 Claims, 2 Drawing Sheets

WIDEBAND WAVE ABSORBER

FIELD OF THE INVENTION

The present invention relates to a wave absorber, and more specifically, this invention relates to a wideband wave absorber capable of absorbing radio waves of wideband frequencies.

BACKGROUND OF THE INVENTION

As a wave absorber, there have been conventionally known a pyramid wave absorber wherein an urethane foam is impregnated with a conducting material such as carbon, a single-layer wave absorber consisting of a magnetic material whose complex magnetic permeability shows frequency dispersion, such as ferrite, and a composite wave absorber comprising the above-mentioned pyramid wave absorber and the single-layer wave absorber in combination.

In addition, there has been known a wave absorber made of a mat fiber assembly comprising a conductive paint adhered to fibers (hereinafter referred to as mat wave absorber), such as the one applied to a transmitting antenna, for example, at the edge of a parabolic reflector of a parabola transmitting antenna, to prevent interference of a parabola antenna located near.

However, a thin wave absorber such as the aforesaid single-layer wave absorber absorbs only the waves of a narrow frequency range such as from 30 MHz to 400 MHz. On the other hand, a mat type absorber has a drawback that the lower limit of the frequency of the absorbable waves is as high as several thousand MHz, and a wave having a lower frequency than said frequency, for example, 30 MHz cannot be absorbed. In addition, a pyramid or a pyramid• single-layer composite wave absorber capable of absorbing waves over a wide range of frequencies and having a considerable thickness can result in high production cost and reduction of the effective space in an anechoic chamber where the absorber is set.

SUMMARY OF THE INVENTION

Accordingly, an object of the present invention is to solve the aforementioned problems and provide a thin wideband wave absorber capable of absorbing waves over a wide range of frequencies, which is fabricated at a low cost. Thus, the present invention relates to a wideband wave absorber designed to absorb high frequency waves of about 1 MHz or above.

The present inventors have now found that a composite comprising the aforementioned single-layer wave absorber and a mat wave absorber can lead to the achievement of the above-mentioned object, by allowing the single-layer wave absorber to absorb lower frequency waves and the mat wave absorber to absorb higher frequency waves, thus resulting in successful absorption of wideband waves of from lower frequency to higher frequency, and completed the invention.

That is, the wideband wave absorber of the present invention comprises a sintered magnetic tile and a mat fiber assembly comprising magnetic powder adhered directly or indirectly to the fibers therein, said magnetic powder being adhered to the mat fiber assembly by the step of (a) coating a paint composed of the magnetic powder and a latex, (b) thermally spraying the magnetic powder over the mat fiber assembly, or (c) dusting the magnetic powder on the fibers in the assembly having an adhesive layer formed on their surfaces and covering said powder with an adhesive layer, wherein said mat fiber assembly desirably has a density transition effectuated from the top surface to the inside with increasing density, or has a constant density in its entirety and comprises increasing amounts of adhered magnetic powder from the top surface toward the rear side.

DETAILED DESCRIPTION OF THE INVENTION

Figure 1:
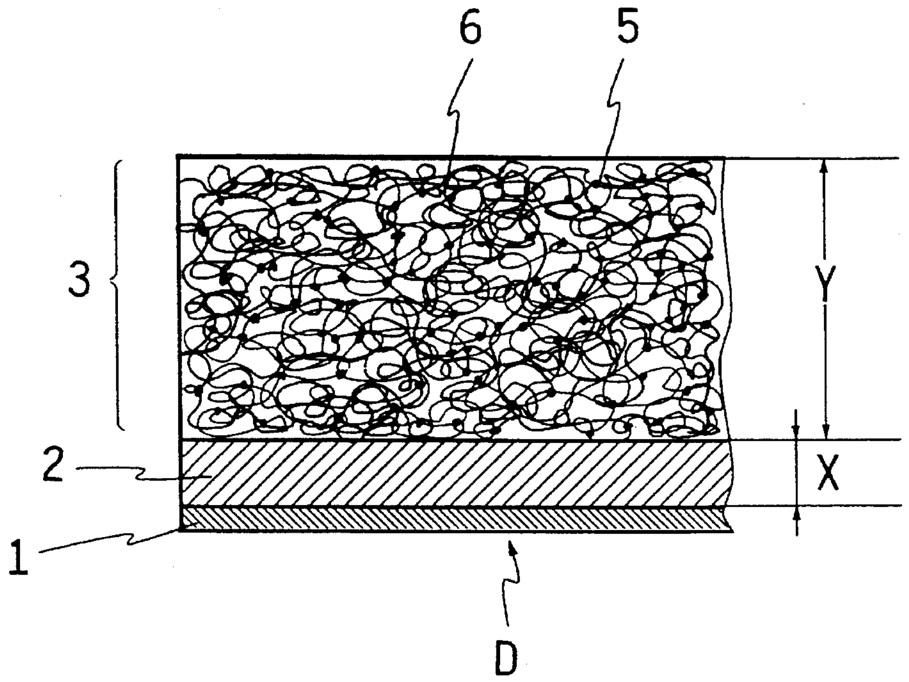
FIG. 1 shows the structure of a wideband wave absorber according to one embodiment of the present invention.

The present invention is more detailedly explained by referring to the drawings.

FIG. 1 graphically shows the structure of the wideband wave absorber of the present invention, wherein D is a wave absorber comprising a sintered magnetic tile 2, and a mat fiber assembly 3 comprising a magnetic powder 5 adhered to a fiber 6, the mat fiber assembly being generally applied to the incident surface for the waves to be absorbed.

The magnetic powder 5 is adhered to the aforementioned mat fiber assembly 3 such that the powder is adhered to the fibers 6 entangled with one another.

Note that a sheet reflector 1 made of a metal, such as iron, copper, brass, nickel, or galvanized sheet steel is formed on the rear side of the sintered magnetic tile 2.

Said sintered magnetic tile 2 can absorb waves of lower frequency range such as from 30 MHz to 400 MHz, and the sintered magnetic tile may be any insofar as it has such desired function. Examples of the sintered magnetic tile 2 include those manufactured by conventional means into sintered tiles, for example, by mixing-finely divided materials such as $Fe_2O_3$, MnO, ZnO, and the like and adding a binder such as polyvinyl alcohol (PVA).

In the present invention, the thickness X of the sintered magnetic tile 2 is generally 3–10 mm, preferably 4–6 mm, though it is subject to variation depending on the materials to be used therefor. When the thickness of this tile is not less than 3 mm, the desired wave absorption can be attained at a lower frequency band of not more than 100 MHz. On the other hand, a thickness of not more than 10 mm results in desirably superior wave absorption at a frequency band of several hundred MHz.

The mat fiber assembly 3 can absorb higher frequency waves, and is manufactured by entangling fibers with one another in an unoriented fashion into a mat form. The thickness Y of the mat is generally 20–80 mm, preferably 30–70 mm, and particularly preferably 40–60 mm.

The thickness of the mat fiber assembly of not less than 20 mm and not more than 80 mm desirably results in superior wave absorption at higher frequency bands exceeding 1 GHz.

Since said mat fiber assembly 3 may be dissociated loose due to the possible untangling of the fibers comprised therein, it is desirable that the fiber junctions should be fused or bonded with an adhesive, thereby to prevent the dissociation.

The fiber constituting the mat fiber assembly 3 is exemplified by natural fibers such as cotton and hemp, and synthetic fibers made from organic polymers. While there is no particular limitation imposed on the kind of the synthetic fiber, preferred are those made from (a) polar organic polymer(s) having a dielectric constant of not less than 2.8. Specific examples thereof include polyvinylidene chloride, nylon, polyester, and polyacryl, with preference given to polyvinylidene chloride in terms of weather resistance and flame resistance.

The fibers may have a uniform fiber thickness. However, it is preferable that the fibers of at least two different thicknesses should be mixed. For example, a mixed use of 10–90% by weight of 50–200 denier thin fibers and 90–10% by weight of 500–1200 denier thick fibers is preferable.

In the present invention, a magnetic powder is adhered to the fibers in the mat fiber assembly. The magnetic powder may be any insofar as its complex magnetic permeability shows frequency dispersion. Examples thereof include Mn—Zn ferrite, Ni—Zn ferrite, Ni—Cu—Zn ferrite, Ni—Mg ferrite, Cu—Zn ferrite, Ni ferrite, Li ferrite, Ga ferrite, YIG, and so on. A powder prepared by pulverizing the aforementioned magnetic material(s) in a ball mill to give a powder having an average particle diameter of 0.5–30 μm, preferably 1–10 μm, particularly preferably 2–4 μm is preferably used in the present invention.

When the particle diameter of the aforementioned magnetic powder is not greater than 30 μm, processability becomes superior due to the absence of particle sedimentation when mixed with latex, and when the diameter is not smaller than 0.5 μm, processability is also fine since the powder does not float in the air.

The method for adhering the magnetic powder to the fiber includes, for example, a method wherein a paint comprising a magnetic powder mixed and dispersed therein is applied to a mat fiber assembly by dip coating or spray coating, followed by heating to dryness as necessary, and a method wherein a magnetic powder is thermally sprayed, upon treatment of the particle surface with a suitable resin, directly over a mat fiber assembly. Also, a magnetic powder may be dusted on an adhesive layer formed on the fiber surface, and covered with an adhesive to fix the surface. The adhesive layer is subject to no particular limitation insofar as it has insulating properties, and is exemplified by organic polymer latex such as vinylidene chloride latex.

For example, an adhesive layer is formed on the fiber surface with vinylidene chloride latex, and magnetic powder is injected thereon, whereupon vinylidene chloride latex is sprayed to prevent falling off of the magnetic powder.

As the paint, usable is the one obtained by mixing a magnetic powder with an organic polymer latex and thoroughly dispersing the powder. Various organic polymer emulsions are usable as the organic polymer latex, with preference given to those exhibiting excellent adhesion to the above-mentioned fiber. For example, when the fiber is a polyvinylidene chloride fiber, those having equivalent solubility parameters, polyvinylidene chloride composed of the materials similar to the aforementioned in kind, and emulsions containing polyvinylidene chloride and polyvinyl chloride, which can reveal excellent adhesion are preferable.

The solid content of the organic polymer latex is 10–80% by weight, preferably 20–70% by weight.

In the paint, magnetic powder is contained in an amount of 100–500 parts by weight, preferably 200–400 parts by weight per 100 parts by weight of a latex, which is thoroughly mixed in a screw mixer or the like for effective and uniform dispersion.

The above-mentioned paint may further contain sedimentation preventive, drop preventive, defoaming agent, and grafite and carbon for improving weather resistance, on demand.

The reflector 1 to be formed on the bottom side of the sintered magnetic tile 2 shields off extraneous electromagnetic waves, and permits absorption of, of the waves incident on the wave absorber, the waves which have not been absorbed. The unabsorbed waves are absorbed when reflected toward the plane of incidence, whereby the wave absorption can be enhanced.

The reflector may be made of any metal so long as it can reflect wideband waves, and is exemplified by iron sheet and galvanized sheet steel.

The thickness of the reflector is 0.5–5 mm, preferably 1–3 mm. It may be a laminate having an insulating layer interposed in the middle.

The wideband wave absorber D of the present invention is fabricated by, for example, adhering the mat fiber assembly 3 comprising the magnetic powder 5 adhered to the fiber 6, to the sintered magnetic tile 2 with an adhesive such as an epoxy adhesive, isocyanate adhesive, or cyanoacrylate adhesive. In particular, epoxy has a suitable viscosity to afford good adhesion between the tile and uneven surfaces and is advantageously used. By using an epoxy adhesive, a stable adhesion can be sustained for a long time.

According to the above-mentioned structure, the thickness of the entire wave absorber can be made as thin as about 60 mm, which is considerably smaller than the conventional pyramid type wave absorbers and pyramid.single-layer type wave absorbers. Such advantageous thinness of the wave absorber of the present invention has been achieved by the structure wherein a mat fiber assembly comprising magnetic powder adhered to fibers, is formed on a sintered magnetic tile.

In the wideband wave absorber having this structure, lower frequency band waves are absorbed by the sintered magnetic tile, and higher frequency waves are absorbed by the mat fiber assembly.

Accordingly, although the wave absorber of the present invention is thin, it can absorb wideband waves of particularly from 30 MHz to 4 GHz.

So as to keep the wave reflection on the surface of the wave absorber (plane of wave incidence) at low level, transition of the density in the mat fiber assembly is preferably effectuated from the top surface to the bottom with increasing density. For example, the density of the top surface is 10–40 kg/m$^3$, preferably 20–30 kg/m$^3$, which is gradually changed to 40–80 kg/m$^3$, preferably 50–70 kg/m$^3$ near the sintered magnetic tile. Alternatively, the density of the mat fiber assembly is made constant, and the amount of the magnetic powder adhered to the fiber is increased from the top surface to the rear side. For example, the amount of the magnetic powder near the top surface is 5–15 kg/m$^2$, and that near the rear side thereof is 20–40 kg/m$^2$.

By employing the above structure, the wideband wave absorber can be made thin, and the properties with regard to oblique incidence can be improved.

Also, a color layer may be formed on the mat fiber assembly so that a design effect can be produced. Or, a dustproof layer may be formed on the surface thereof in consideration of its use in a clean room.

For an improved wave absorbing property at higher frequency range, for example, a pyramid wave absorber made of the aforementioned urethane foam impregnated with a resistor such as carbon may be adhered to the mat fiber assembly to give a pyramid•mat•single-layer composite wave absorber. Such structure permits enlargement of the range of absorbable waves up to a higher frequency of e.g. about 40 GHz.

It has been expressly described in the foregoing description that the construction of the present invention permits a thin wave absorber which can absorb waves of from lower frequency range to higher frequency range. In other words, the thin wave absorber of the present invention can absorb waves over a wide range of frequencies.

The extremely thin, wideband wave absorber of the present invention is advantageous in that it can be manufactured at a low cost, and it can be used most suitably in an anechoic chamber for the measurement and assessment of immunity against leakage waves and/or jamming waves from electronic equipments, since the indoor volume can be used efficiently due to the compact volume of the absorber to be installed therein.

According to the present invention, a thin wave absorber capable of absorbing waves over a wide range of frequencies can be provided at a low cost.

The present invention is more detailedly explained in the following by referring to examples, to which the invention is not limited.

EXAMPLE 1

Polyvinylidene chloride fibers (1000 denier) were tangled with one another, and bonded at their junctions with latex (R14A, manufactured by Kureha Chemical Industry, Co., Ltd., Japan) for prevention of untangling, thereby to form a 50 mm-thick mat fiber assembly having a density of 30 kg/m$^3$ on the top surface and 60 kg/m$^3$ on the reverse side.

Then, a paint comprising ferrite (400 parts by weight), latex (R14A, manufactured by Kureha Chemical Industry, Co., Ltd., Japan, 100 parts by weight), and carbon (4 parts by weight), which had been prepared separately, was dip-coated on the mat fiber assembly, and dried at 85° C. for 180 minutes. This step was repeated three times to afford a magnetic layer of a predetermined thickness and sufficient adhesion of the ferrite powder to the fibers in the assembly, whereby a mat wave absorber was fabricated. The average amount of the adhered magnetic powder was 20 kg/m$^2$.

The obtained mat wave absorber was adhered to one surface of a 5.5 mm-thick sintered ferrite tile plate with an epoxy resin adhesive.

Further, a 1 mm-thick steel reflector plate was adhered to the opposite surface of the sintered ferrite tile plate to give an about 60 mm-thick wave absorber D having the structure of FIG. 1.

EXAMPLE 2

Figure 2:
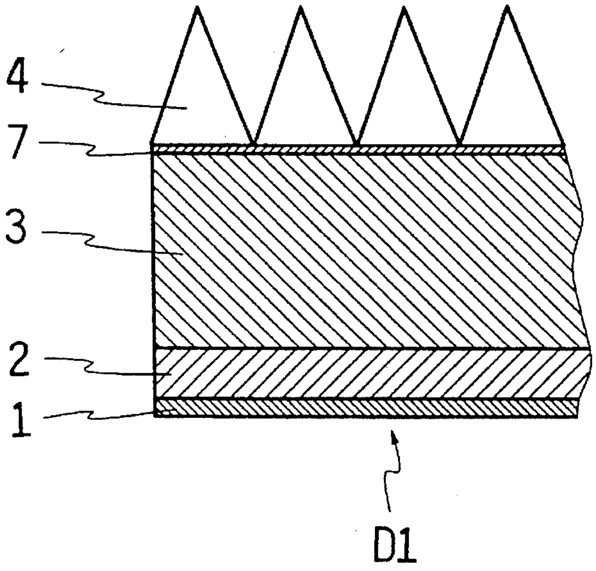
FIG. 2 shows the structure of a wideband wave absorber according to another embodiment of the present invention.

A 200 mm-thick pyramid wave absorber 4 as shown in FIG. 2, which was made of a polyurethane foam as the main component and prepared separately, was adhered to a mat fiber assembly of a wave absorber manufactured in the same manner as in Example 1, with an epoxy resin adhesive 7 to give a pyramid•mat fiber assembly•single-layer composite wave absorber D1.

EXAMPLE 3

Ferrite powder was thermally sprayed over the surface of a mat fiber assembly manufactured in the same manner as in Example 1, thus allowing the ferrite powder to adhere to the fibers in the fiber assembly, to give a mat fiber assembly. In the same manner as in Example 1, a sintered ferrite tile and a steel reflector plate was adhered to the assembly to give a wave absorber.

EXAMPLE 4

A wave absorber was manufactured in the same manner as in Example 1 except that the density of the mat fiber assembly was 30 kg/m$^3$ in its entirety and the thickness of the assembly was 50 mm. The average amount of the adhered magnetic powder was 23 kg/m$^2$.

EXAMPLE 5

A wave absorber was manufactured in the same manner as in Example 1 except that the density of the mat fiber assembly was 30 kg/m$^3$ in its entirety, the amount of the magnetic powder adhered to the top surface of the assembly was 10 kg/m$^2$, and that at the bottom thereof was 30 kg/m$^2$.

Comparative Example 1

A mat wave absorber was manufactured by adhering a mat fiber assembly prepared in the same manner as in Example 1 to a 1 mm-thick steel sheet reflector.

Comparative Example 2

A ferrite wave absorber was manufactured by adhering a 1 mm-thick steel sheet reflector to one side of the same sintered ferrite tile plate used in Example 1.

Evaluation of wave absorbing properties

Using the wave absorbers as manufactured in the above-mentioned Examples 1–5 and Comparative Examples 1–2, reflection loss vs. frequency was measured, the results of which are given in Table 1.

Figure 3:
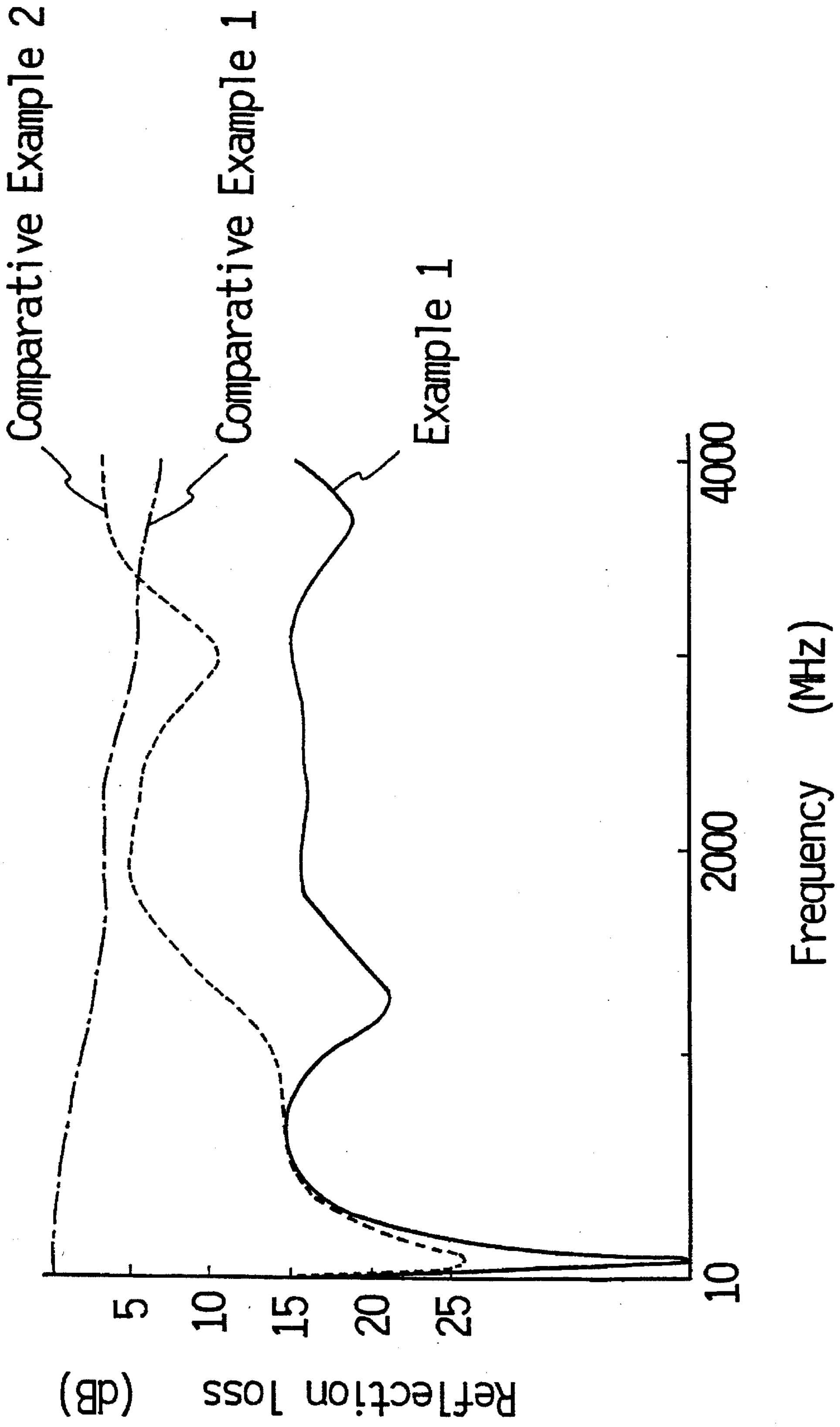
FIG. 3 is a graph showing the reflection loss vs. frequency of the wave absorbers of Example 1, Comparative Example 1, and Comparative Example 2.

FIG. 3 is a graph showing the reflection loss vs. frequency of the wave absorbers of Example 1, Comparative Example 1, and Comparative Example 2.

The reflection loss vs. frequency was measured as follows. The wave absorber of the present invention was prepared into a doughnut-shape specimen having an inner diameter of 16.9 mm and an outer diameter of 38.8 mm. The specimen was inserted in a WX-39D coaxial waveguide. One end on the specimen side was short-circuited, and a wave was transmitted from the other end to measure the amount of the wave reflected back. The reflection coefficient at the wave input end was measured by reflection coefficient bridge.

TABLE 1

| | | Example | | | | | Comparative Example | |
|---|---|---|---|---|---|---|---|---|
| | | 1 | 2 | 3 | 4 | 5 | 1 | 2 |
| Wave Absorber | Structure *1 | A + B | A + B + C | A + B | A + B | A + B | A | B |
| | Thickness | ca. 6 cm | ca. 26 cm | ca. 6 cm | ca. 6 cm | ca. 6 cm | ca. 6 cm | ca. 6 cm |
| | Frequency band *2 | 30 MHz - 4000 MHz | 30 MHz - 40 GHz | 30 MHz - 4000 MHz | 30 MHz - 4000 MHz | 30 MHz - 4000 MHz | nil | 30 MHz - 600 MHz |

Note *1
A: mat wave absorber
B: ferrite wave absorber
C: pyramid wave absorber
*2 Frequency band where absorption of not less than 15 dB was obtained.

As is evident from Table 1, the wave absorber of the present invention could be made as thin as about 60 mm (260 mm when a pyramid layer was formed) at the entire thickness, and the wave absorbing property of the wave absorber of the invention corresponded to the reflection loss of not less than 15 dB (97% or more absorption by power ratio) over a wide frequency range of from 30 MHz to about 4000 MHz, as is evident from FIG. 3. Moreover, the wave absorber of the present invention is advantageous in terms of the cost when considered from the viewpoints of the above-mentioned thickness and the wave absorbing performance.

What is claimed is:

1. A wideband wave absorber comprising a sintered magnetic tile and a mat fiber assembly comprising a magnetic powder adhered directly or indirectly to a fiber in the mat fiber assembly.

2. The wideband wave absorber of claim 1, wherein a paint comprising the magnetic powder and a latex is coated on the mat fiber assembly.

3. The wideband wave absorber of claim 1, wherein the magnetic powder is directly adhered to the mat fiber assembly by thermally spraying.

4. The wideband wave absorber of claim 1, wherein an adhesive layer is provided on a surface of the fiber, and the magnetic powder is fixed to the fiber the adhesive layer.

5. The wideband wave absorber of claim 1, wherein the mat fiber assembly has graded density from the top surface to the bottom with increasing density.

6. The wideband wave absorber of claim 5, wherein the mat fiber assembly has a density of from 10 kg/m$^3$ to 40 kg/m$^3$ at the incident surface and a density of from 40 kg/m$^3$ to 80 kg/m$^3$ at the opposite side thereof.

7. A wideband wave absorber comprising, a sintered magnetic tile and a mat fiber assembly comprising a magnetic powder adhered directly or indirectly to a fiber in the mat fiber assembly, wherein the density of the fiber assembly is constant and the mount of the magnetic powder adhered to the assembly is increased from the top surface to the bottom.

8. The wideband wave absorber of claim 1, wherein the mat fiber assembly has a thickness of from 20 mm to 80 mm.

9. The wideband wave absorber of claim 1, wherein the mat fiber assembly is made of a synthetic fiber made from (a) polar organic polymer(s) having a dielectric constant of not less than 2.8.

10. A wideband wave absorber comprising a sintered magnetic title and a mat fiber assembly comprising a magnetic powder adhered directly or indirectly to a fiber in the mat fiber assembly, wherein the mat fiber assembly comprises 10–90% by weight of 50–200 denier thin fibers and 90–10% by weight of 500–1200 denier thick fibers.

* * * * *